United States Patent [19]

Suffi

[11] 4,346,956
[45] Aug. 31, 1982

[54] DISTRIBUTING FRAME AND TERMINAL BLOCK MEMBER ASSEMBLIES

[75] Inventor: Louis Suffi, Westchester, Ill.

[73] Assignee: Northern Telecom, Inc., Nashville, Tenn.

[21] Appl. No.: 141,260

[22] Filed: Apr. 17, 1980

[51] Int. Cl.³ .......................................... H01R 13/60
[52] U.S. Cl. .............................. 339/119 R; 248/274; 339/198 G
[58] Field of Search ....... 339/119 R, 198 G, 198 GA; 248/558, 274, 288.1, 298, 295.1

[56] References Cited

U.S. PATENT DOCUMENTS

| | | | |
|---|---|---|---|
| 2,697,572 | 12/1954 | Pfankuch | 248/295.1 X |
| 3,135,572 | 6/1964 | Curtis et al. | 339/198 GA |
| 3,474,392 | 10/1969 | Norden | 339/119 R |
| 3,915,541 | 10/1975 | Flegel | 339/119 R |
| 4,111,390 | 9/1978 | St. Jean | 248/274 |

Primary Examiner—Eugene F. Desmond
Attorney, Agent, or Firm—Spencer & Kaye

[57] ABSTRACT

A distributing frame having a terminal block member attached to it by a mounting bracket which is secured either to the block member or a frame member by one of two interconnected mounting parts lying in different planes. Loosening of screw securing means passing through one of the mounting parts allows for relative movement of the mounting bracket and the respective member to reposition the securing means in the other mounting parts. This causes change in the angle of orientation of the bracket and respective member and thus causes the block member to pivot on the frame member. To connect electrical wiring to terminals on each side of the block member, it may thus be mounted in one of two alternative positions without removal from the frame while using a simple, one-piece bracket.

3 Claims, 8 Drawing Figures

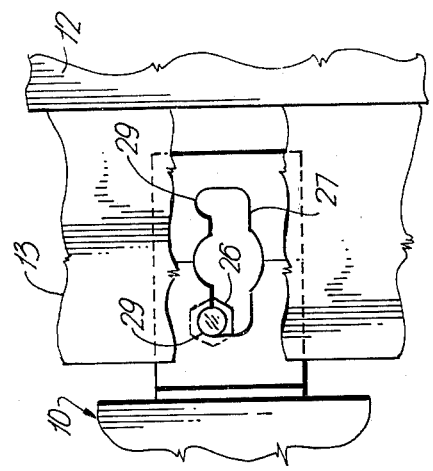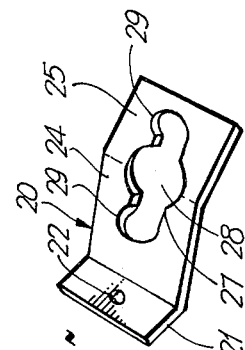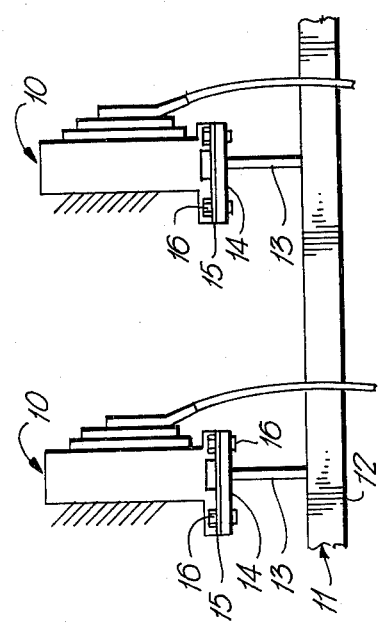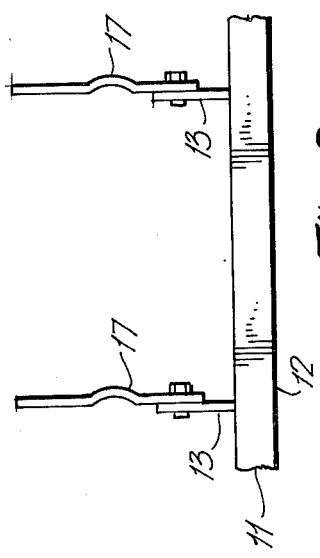

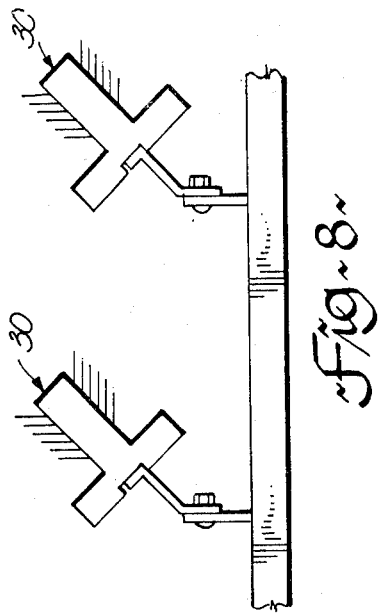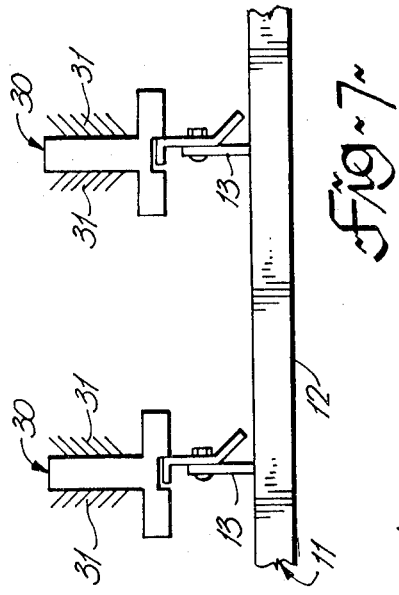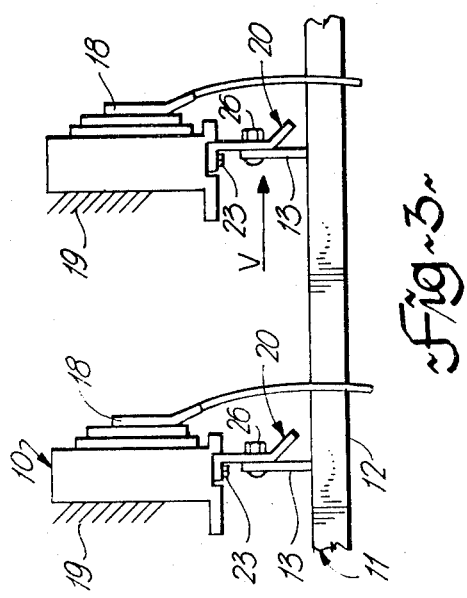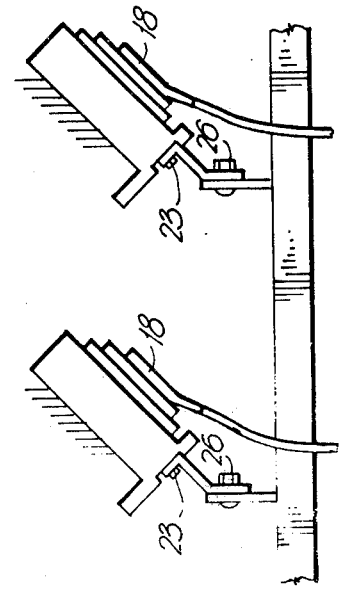

DISTRIBUTING FRAME AND TERMINAL BLOCK MEMBER ASSEMBLIES

This invention relates to distributing frame and terminal block member assemblies for telecommunications equipment.

Telecommunications companies install in their telecommunications office, distributing frames which carry dismountable terminal block members.

Different terminal block member designs are used, dependent upon functional requirements. As wiring is to be connected to both sides of a terminal block member, then both sides need to be accessible for wire connection purposes by a person standing at one side of a distributing frame.

Because of different methods of attachment of terminal block members and protector blocks, distributing frames may need to be equipped with welded metal pads on vertical mounting members for mounting the terminal block members or equipped with vertical mounting members which are pretapped to mount the protector blocks. Unfortunately, because of the different attachment methods, it has not been possible to use a single distributing frame for either the terminal block members or the protector blocks on the same grid configuration which is mounted on the frame. Further, the use of welded metal pads results in the terminal block members being immovable upon their distributing frames. This has increased the difficulty of access to both sides of a block member for wiring purposes. In another construction, it is known to include pivotal or hinged mounting devices to pivot terminal block members to distributing frames to enable ease of access to both sides of the members for wiring purposes. These mounting devices are expensive.

The present invention provides a distributing frame and terminal block member assembly in which the use of welded metal pads for mounting block members to frame members is avoided upon vertical mounting members while change in orientation of the block members is possible without the use of mounting arrangements having pivotal or hinge sections.

According to the present invention there is provided a distributing frame and terminal block member assembly in which the frame has a frame member, at least one terminal block member, and at least one interconnecting mounting bracket and securing means by which the terminal block member is secured to the frame member, the mounting bracket having first and second mounting parts against one of which one of the members is secured, the mounting parts being interconnected, lying in different planes, and having receiving means for the securing means, which receiving means extends from one mounting part to the other to enable said one member and the mounting bracket to be relatively moved with the securing means loosened and by movement of the securing means along the receiving means to bring said one member against the other mounting part while changing the angle of orientation between the bracket and said one member.

In the above assembly according to the invention, the interconnecting mounting bracket and securing means replaces the welded pad. Welded pads have prevented the mounting of protector blocks upon the frames previously, but their replacement results in a distributing frame which may be used either for terminal block members or for protector blocks.

In a preferred construction, the securing means comprises a screw threaded means which passes through a slot formed in the mounting bracket, sides of the slot forming the receiving means. The slot extends from the first to the second mounting parts so that during movement of the securing means along the slot, either the bracket or said one member has to be turned to move it from one mounting part to the other. The securing means may, alternatively, be a spring loaded peg which in a normal position is spring urged to hold the mounting bracket and said one member secured together.

One embodiment of the invention will now be described, by way of example, with reference to the accompanying drawings in which:

FIG. 1 is a horizontal cross-sectional view through part of a distributing frame and connectorized line terminal block assembly according to prior usage;

FIG. 2 is a view similar to FIG. 1 of a distributing frame equipped for the mounting of protector blocks according to prior usage;

FIG. 3 is a horizontal cross-sectional view through part of a distributing frame and connectorized line assembly according to a first embodiment of the invention and showing terminal block members in one connector mounting position;

FIG. 4 is a similar view to FIG. 3 and showing the terminal block members in another position;

FIG. 5 is a view in the direction of arrow "V" in FIG. 3, on a large scale, with part of a distributing frame removed for clarity;

FIG. 6 is an isometric view of a mounting bracket used in the embodiment of FIGS. 3 to 5;

FIG. 7 is a view similar to FIG. 3 of a second embodiment; and

FIG. 8 is a view similar to FIG. 4 of the second embodiment.

As shown in FIG. 1, in an accepted method of assembling terminal block members 10 to a distributing frame 11, the frame comprises horizontal members 12 carrying horizontal spaced vertical mounting members 13. Metal pads 13 are welded in spaced positions along the mounting members 13. Each block member 10 is secured to two metal pads, at top and bottom of the block member, by attachment of each pad to a metal plate 15 by screws 16, the metal plates being mounted upon the block member and extending above and below it for attachment of the screws.

In FIG. 2 there is shown an accepted method of attaching protector blocks to a distributing frame. In this case, the frame 11 is of exactly the same construction as that in FIG. 1 in having horizontal members 12 and vertical mounting members 13. There are no metal pads welded to the members 13. Instead, horizontal brackets 17 extend from members 13 for the mounting of the protector blocks (not shown).

In the above methods of attachment, a distributing frame for use for the terminal block members cannot be used instead for the protector blocks because the metal pads 14 intrude into areas otherwise occupied by the protector blocks. Because of this, it is necessary to build distributing frames specifically either for the terminal block members or for the protector blocks.

In the embodiments described below and according to the invention, it is rendered possible to use the same frame alternatively for terminal block members or protector blocks. Further, the use of the metal pads and plates 14, 15 is avoided together with the welding operation for the pads.

In a first embodiment shown in FIGS. 3 and 4, a distributing frame 11 is as described above in that it has horizontal members 12 and vertical mounting members 13. To some of these mounting members, terminal block members 10 are secured. On one horizontal level of the frame, as shown in FIG. 3, the terminal block members 10 are connectorized line terminal blocks to be joined by a multiple connection 18 on one side to a switchboard or central office equipment, and on the other side by individual wire-wrap terminals 19 to protector blocks and other terminal block members.

To enable wire connections to be made easily by an installer standing to one side of the distributing frame, i.e. upwardly of the block members in the drawings, specially designed interconnecting mounting brackets 20 are provided for the terminal block members 10. Each of these brackets is formed as a single sheet metal pressing. As shown in FIG. 6, each bracket has a main body having a short right-angled flange 21, formed with a hole 22 by which it is attached to its terminal block member by screw 23 (FIGS. 3 and 4). The main body comprises first and second mounting parts 24 and 25 for mounting the bracket and thus the terminal block member onto a vertical mounting member 13 by a securing means in the form of a screw 26. As is readily seen from the drawings, the second mounting part 25, while being interconnected with part 24, extends from it at an angle so that the two parts 24 and 25 lie in different planes. The angle of these planes is a matter of choice or is dependent upon the design of the distributing frame and the terminal block members, but must be such as to allow for ease for making wire connections to each side of the block members 10 as will be described. In the embodiment being described, the angle is approximately 45° to allow for a tilt of each terminal block member 10 by this angle.

The mounting parts of each bracket 20 are formed with a slot 27 for receiving the screw 26 and for allowing it to move from end-to-end of the slot. The slot, midway between its ends, is enlarged as at 28 to enable the head of the screw to pass through the enlargement to be received within the slot. Also at each end the slot is enlarged slightly to one side, as at 29 for a purpose to be described.

To assemble each terminal block member onto a vertical mounting member, two vertically spaced and aligned brackets 20 are screwed to the block member by screws 23. The screws 26 for the brackets are then screwed loosely into suitably spaced and tapped holes in vertical mounting member 13. Each block member 10 is then positioned upon the mounting member 13 by passage of the heads of screws 26 through the enlargement 28 in slots 27 to the other side of the brackets 20. The brackets 20 are then moved inwardly of the distributing frame 11 to locate the screws through the end of each slot in the bracket mounting part 24. The enlarged ends 29 of the slot extend upwardly and the weight of the bracket and the terminal block member causes them to drop slightly to locate each screw 26 in the enlarged end 29 as shown in FIG. 5. This prevents slippage of the bracket upon the mounting member 13. This then locates each terminal block member in the position shown in FIG. 3. The screws 26 are then tightened and sides of the slot act as screw receiving means. The multiple connectors 18 are then connected to the one side of each terminal block member as shown.

The screws 26 are loosened. The block members 10 are turned from the position of FIG. 3, to that shown in FIG. 4 by pulling outwardly on the block members to cause the brackets 20 to turn upon mounting members 13. This movement is allowed for by movement of screws 26 along the slots 27 and into the second mounting parts 25 of the brackets as shown by FIG. 4. The screws are then retightened after the brackets and block members have again dropped under their own weight to locate the screws in the other enlarged ends 29 of the holes.

Under normal circumstances, the block members 10 remain in the positions of FIG. 4 to make the terminals 19 completely accessible for any changes. However, if it is necessary to work on the multiple connectors 18, it is a simple matter to loosen screw 26 and turn each block member to the FIG. 3 position.

In the above described assembly and according to the invention, the brackets are designed to allow for turning movement of the terminal block members whereby wiring connections may be made to both sides. Thus a bracket of simple design, and possibly in one intergral piece as in the embodiment, enables the same advantages to be obtained as are conventionally obtained in assemblies utilizing complex brackets with relatively pivotal parts. Also in the construction described, the use of the slot enlargement 28 enables the screws to be inserted prior to offering terminal block members up to the frame whereby assembly is made easier.

As may be seen, the use of the bracket 20 avoids the need for the prior welded metal pads and metal plates between pads and terminal block members. The importance of this step is that one design of distributing frame is usable for both the terminal block members (as in FIGS. 3 and 4) and for the protector blocks; this involves the removal of brackets 20 and attachment of the horizontal brackets 17 to give the construction shown by FIG. 2 for attachment of protector blocks. It follows that less parts are required for assembly of block members and the inventory for distributing frames is halved while enabling the terminal block members to be pivoted as described above. This may produce an overall cost reduction.

Further, because of the avoidance of welding operations and simplified access to connection points, there is a reduction in installation time required for the terminal block members. There is also greater flexibility in the use of distributing frames after installation and time is speeded up for change around in previously used frames by repositioning of terminal block members and protector blocks.

In a second embodiment shown in FIGS. 7 and 8, line terminal block members 30 having wire wrap connections 31 on both sides are mounted upon vertical mounting members 13 of a frame by brackets 20 in a similar manner to that of the first embodiment. In the initial position of attachment, the connections 31 on the right hand side in FIG. 7 are connected to switchboard or central office equipment. The block members 30 are then pivoted to the position of FIG. 8 for connection to the protector blocks and other terminal block members by use of the wire wrap connections on the left hand side.

What is claimed is:

1. A distributing frame and terminal block member comprising: a frame which has a first frame member and a plurality of second frame members spaced appart and secured in a row to said first frame member;
a plurality of terminal blocks;

a plurality of one-piece mounting brackets each mounting a single terminal block and each connected to a separate one of said second frame members;

each mounting bracket comprising a flanged end secured to its terminal block and a body comprising two interconnected parts lying in different planes from one another, the body being formed with a slot extending from one to the other of the body parts and being mountable upon the second frame member by a screw passing through the slot into the second frame member, the bracket being movable upon the second frame member to slide the slot along the screw, when the screw is loosened, to move the screw from end to end of the slot and change the angle of orientation of the bracket relative to the second frame member, by virtue of the body parts lying in their different planes, and thus change the orientation of the associated terminal block independent of the orientation to all other terminal blocks in said row.

2. An assembly according to claim 1, wherein the bracket is formed with an enlargement to the slot to enable a head of the screw to pass therethrough, said enlargement being spaced from slot positions for screw location when tightened in said first and second body parts.

3. An assembly according to claim 1 wherein each end of the slot is formed with an enlarged side for the location of the screw upon being located at that end of the slot.

* * * * *